(12) United States Patent
Uchida et al.

(10) Patent No.: US 7,261,569 B2
(45) Date of Patent: Aug. 28, 2007

(54) CONNECTION STRUCTURE OF PRINTED WIRING BOARD

(75) Inventors: Shinji Uchida, Kanagawa (JP); Yoshiyuki Nakai, Kanagawa (JP); Tadashi Inoue, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/554,741

(22) PCT Filed: Mar. 23, 2004

(86) PCT No.: PCT/JP2004/003939

§ 371 (c)(1),
(2), (4) Date: Oct. 28, 2005

(87) PCT Pub. No.: WO2004/098248

PCT Pub. Date: Nov. 11, 2004

(65) Prior Publication Data

US 2006/0234521 A1 Oct. 19, 2006

(30) Foreign Application Priority Data

Apr. 30, 2003 (JP) .............................. 2003-125678

(51) Int. Cl.
  *H01R 12/00* (2006.01)
(52) U.S. Cl. ........................................ 439/67; 439/492
(58) Field of Classification Search ................ 439/492, 439/67, 77, 495, 496, 660
See application file for complete search history.

(56) References Cited

U.S. PATENT DOCUMENTS

| | | | | |
|---|---|---|---|---|
| 3,950,070 A | * | 4/1976 | Groft et al. | ................. 439/422 |
| 5,616,050 A | * | 4/1997 | Suski | ......................... 439/495 |
| 5,697,794 A | * | 12/1997 | Mosquera | ..................... 439/67 |
| 5,741,148 A | * | 4/1998 | Biernath | ...................... 439/284 |
| 6,338,631 B1 | * | 1/2002 | Hashimoto et al. | ........... 439/79 |
| 6,371,797 B1 | * | 4/2002 | Kikuchi et al. | ............. 439/496 |
| 6,551,113 B1 | * | 4/2003 | Nishiyama et al. | ........... 439/67 |
| 6,781,230 B2 | * | 8/2004 | Tsukamoto | ................. 257/700 |

FOREIGN PATENT DOCUMENTS

| | | |
|---|---|---|
| JP | H08-500202 A | 11/1993 |
| JP | H07-183070 A | 7/1995 |
| JP | H09-102368 A | 4/1997 |
| JP | 2002-015800 A | 1/2002 |
| JP | 2002-083648 A | 3/2002 |
| JP | 2002-158055 A | 5/2002 |

* cited by examiner

OTHER PUBLICATIONS

International Search Report mailed on May 11, 2004.

*Primary Examiner*—Hien Vu
(74) *Attorney, Agent, or Firm*—Rader, Fishman & Grauer PLLC (57) ABSTRACT

A connecting structure is for a printed wiring board to be electrically connected to a FPC. The FPC includes a substrate and electro-conductive portions. The printed wiring board includes an insertion opening provided on an edge surface thereof, and line connecting terminals formed on an inner wall face of the insertion opening. A dual in-line contact member including first contact members is fixed to the top end portion of the FPC. Each first contact member includes a main body, and a first arm and a second arm extending from the main body generally in parallel to each other. Furthermore, the first arm and the second arm are bent at bent portions so as to form curves protruding away from each other. With the present embodiment, at least one of the first arm and the second arm press the corresponding line connecting terminal provided within the insertion opening at the bent portion thereof by inserting the FPC to the insertion opening of the printed wiring board. Thus, the FPC is connected to the edge surface of the printed wiring board. This improves the freedom from the perspective of design of the wiring pattern as well as allowing mounting of circuit components with high circuit density.

5 Claims, 9 Drawing Sheets

CONNECTION STRUCTURE OF PRINTED WIRING BOARD

FIELD OF THE INVENTION

The present invention relates to a connection structure for a printed wiring board. More particularly, the present invention relates to a connection structure for a printed wiring board for electrically connecting a FPC (Flexible Printed Circuit) and a printed wiring board formed by stacking plural plate members.

RELATED ART

Modules of electronic parts and printed wiring boards are mounted in electronic devices. Conventionally, FPCs, or Flexible Flat Cables, have been used to connect these printed wiring boards and modules of electronic parts.

Here, a printed wiring board includes a base plate having an insulating substrate and a wiring pattern formed on this substrate, and circuit elements, such as ICs and connectors, which are connected to the wiring pattern on the base plate. ZIF (Zero Insertion Force)-type connectors which enable FPCs to be inserted and removed with little force are connectors used as circuit elements mounted on printed wiring boards (for example, see Japanese Patent Application Laid-open Publication No. 2002-158055).

According to this ZIF-type connector, operability of the FPC and a slider can be improved and connection reliability can be ensured, and miniaturization can be realized as well.

Incidentally, the miniaturization of electronic devices such as mobile phones and mobile devices has been progressing in recent years, and with this miniaturization of electronic devices, the miniaturization and the high-integration of FPCs and printed wiring boards are also in demand. Therefore, in order to meet this demand, in recent years, multilayer printed wiring boards formed by stacking plural base plates have come into wide use.

However, although the above ZIF-type connector realizes low height, it occupies a certain area on the base plate because it is mounted on the surface of the base plate. Therefore, there were instances in which mounting of circuit elements with high density was difficult.

SUMMARY OF THE INVENTION

In order to solve the above problems, an object of the present invention is to provide a connection structure for printed wiring boards which enables circuit elements to be mounted at high density.

The inventors have invented a connection structure for printed wiring boards in order to satisfy the above object such as described below.

(1) A connecting structure for a printed wiring board to be electrically connected to a FPC, the FPC including: an elongated substrate, and plural electro-conductive portions layered on a surface of the substrate so as to extend in an axial direction of the substrate; the printed wiring board including: an insertion opening formed on an edge surface thereof for inserting a top end portion of the FPC, and plural line connecting terminals formed on an inner wall face of the insertion opening so as to extend in an insertion direction for inserting the FPC; in which a dual in-line contact member having plural elastically deformable first contact members is fixed to the top end portion of the FPC; each of the first contact members includes a main body contacting with the top end portion of the FPC, and a first arm and a second arm extending from the main body generally in parallel to each other pinching the electro-conductive member of the FPC therebetween; the first arm and the second arm are bent at bent portions so as to form curves protruding away from each other; at least one of the first arm and the second arm presses the line connecting terminal within the insertion opening at the bent portion thereof by inserting the FPC into the insertion opening of the printed wiring board.

An FFC (Flexible Flat Cable) may be employed as the FPC. The substrate may be formed of a thin polyimide film, for example. Furthermore, a reinforcing plate may be layered on the substrate.

The electro-conductive portions should be formed of a material having sufficient electro conductivity and formability. For example, copper alloy may be employed. Furthermore, the electro-conductive portions may be subjected to nickel plating. Furthermore, the electro-conductive portions may be subjected to hard electro-conductive-material plating. Furthermore, the base end portion of each electro-conductive portion may be coated with polyimide film.

The electro-conductive portions may be formed by etching a conductor after the conductor has been layered (adhered) on the elongated substrate. Furthermore, each electro-conductive portion may be connected to a low-voltage power supply or grounding wire.

Each of the first contact members may be formed of a copper alloy plate for ensuring sufficient electro conductivity. A phosphor bronze plate or a beryllium bronze plate is more preferable as the copper alloy plate. Also, each first contact member may be formed of a thin steel plate for ensuring sufficient wear resistance.

Each first contact member may be subjected to nickel plating or chrome plating. Furthermore, each first contact member thus subjected to such plating may be further subjected to gold flash plating, thereby reducing contact resistance.

The curvatures of the first arm and the second arm are not restricted in particular.

At least one of the first arm and the second arm may be fixed to the corresponding electro-conductive portion of the FPC by soldering.

The printed wiring board may have through holes, via holes, pads-on-holes, and so forth.

Furthermore, an arrangement may be made in which the line connecting terminals are provided to both facing surfaces within the insertion opening so that the first arm and the second arm of each first contact member can be connected to the line connecting terminals. Such a configuration allows the FPC to connect to the printed wiring board in a more reliable manner.

With a first aspect of the present invention described in (1), when the FPC is inserted into the insertion opening of the printed wiring board, the bent portions of the first arm and the second arm are pressed into contact with the inner wall faces of the insertion opening, and are elastically bent toward the corresponding electro-conductive portion. When the FPC is inserted further, the bent portions are pressed into contact with the corresponding line connecting terminals.

Thus, the FPC is connected to an edge surface of the printed wiring board. This improves the freedom of design of the wiring pattern as well as allowing mounting of circuit elements at high density.

Furthermore, the FPC according to the present invention is formed simply by mounting the first contact terminals onto an existing FPC having the substrate and the electro-conductive portions, thereby allowing the user to connect such an existing FPC to the printed wiring board. This allows manufacturing costs of the FPC to be reduced.

(2) In a connecting structure for a printed wiring board according to (1), the dual in-line contact member includes a first header holding the main bodies of the first contact members in a state in which the first contact members are arrayed.

The first header may be formed of a synthetic resin.

With a second aspect of the present invention described in (2), the first contact members are arrayed with sufficient precision. This allows the user to connect the FPC to the printed wiring board in a more reliable manner.

(3) A connecting structure for a printed wiring board to be electrically connected to a FPC, the FPC including: an elongated substrate, and plural electro-conductive portions layered on a surface of the substrate so as to extend in an axial direction of the substrate; the printed wiring board including: an insertion opening formed on an edge surface thereof for inserting the top end portion of the FPC, and plural line connecting terminals formed on an inner wall face of the insertion opening so as to extend in an insertion direction for inserting the FPC; in which a first adapting connector having plural elastically deformable second contact members and a first housing holding the second contact members is fixed to the top portion of the FPC; each of the second contact members includes a main body contacting with the top end portion of the FPC, a third arm and a fourth arm extending from the main body generally in parallel to each other pinching the electro-conductive portion therebetween; the fourth arm is bent at a bending portion so as to form a curve protruding outward from the first housing; the first housing holds the third arms of the second contact members in a state in which the second contact members are arrayed; the bent portion of the fourth arm of the second contact member presses the line connecting terminal within the insertion opening by inserting the FPC into the insertion opening of the printed wiring board.

An FFC (Flexible Flat Cable) may be employed as the FPC. The substrate may be formed of a thin polyimide film, for example. Furthermore, a reinforcing plate may be layered on the substrate.

The electro-conductive portions should be formed of a material having sufficient electro conductivity and formability. For example, a copper alloy may be employed. The electro-conductive portions may be subjected to nickel plating and may be subjected to hard electro-conductive-material plating. Furthermore, the base end portion of each electro-conductive portion may be coated with polyimide film.

The electro-conductive portions may be formed by etching a conductor after the conductor has layered (adhered) on the elongated substrate. Furthermore, each electro-conductive portion may be connected to a low-voltage power supply or grounding wire.

Each second contact member may be formed of a copper alloy plate for ensuring sufficient electro conductivity. A phosphor bronze plate or a beryllium bronze plate is more preferable as the copper alloy plate. Also, each second contact member may be formed of a thin steel plate for ensuring sufficient wear resistance.

Each second contact member may be subjected to nickel plating or chrome plating. Furthermore, each second contact member thus subjected to such plating may be further subjected to gold flash plating, thereby reducing contact resistance.

The curvature of each fourth arm is not restricted in particular. Each fourth arm may be fixed to the corresponding electro-conductive portion of the FPC by soldering.

The printed wiring board may have through holes, via holes, pads-on-holes, and so forth.

A second aspect of the present invention described above has the same advantages as that described in the aforementioned first aspect.

(4) A connecting structure for a printed wiring board to be electrically connected to a FPC, the FPC including: an elongated substrate, and plural electro-conductive portions layered on a surface of the substrate so as to extend in an axial direction of the substrate; the printed wiring board including: an insertion opening formed on an edge surface thereof for inserting a top end portion of the FPC, and plural line connecting terminals formed on an inner wall face of the insertion opening so as to extend in an insertion direction for inserting the FPC; a second adapting connector having plural elastically deformable third contact members, a second housing and a second header holding the third contact members is fixed to the top end portion of the FPC; each of the third contact members includes a main body contacting with the top end portion of the FPC, a fifth arm and a sixth arm extending from the main body generally in parallel to each other pinching the FPC therebetween; the sixth arm is bent at a bending portion to form a curve protruding outward from the second housing; the second housing holds the fifth arms of the third contact members in a state in which the third contact members are arrayed; the second header holds the main bodies of the third contact members in a state in which the third contact members are arrayed; the bent portion of the sixth arm of each third contact member presses the line connecting terminal within the insertion opening by inserting the FPC into the insertion opening of the printed wiring board.

An FFC (Flexible Flat Cable) may be employed as the FPC. The substrate may be formed of a thin polyimide film, for example. Furthermore, a reinforcing plate may be layered on the substrate.

The electro-conductive portions should be formed of a material having sufficient electro conductivity and formability. For example, a copper alloy may be employed. Furthermore, the electro-conductive portions may be subjected to nickel plating. The electro conductive portions may be subjected to hard electro-conductive-material plating. Furthermore, the base end portion of each electro-conductive portion may be coated with polyimide film.

The electro-conductive portions may be formed by etching a conductor after the conductor has layered (adhered) on the elongated substrate. Furthermore, each electro-conductive portion may be connected to a low-voltage power supply or grounding wire.

Each third contact member may be formed of a copper alloy plate for ensuring sufficient electro conductivity. A phosphor bronze plate or a beryllium bronze plate is more preferable as the copper alloy plate. Also, each third contact member may be formed of a thin steel plate for ensuring sufficient wear resistance.

Each third contact member may be subjected to nickel plating or chrome plating. Furthermore, each third contact member thus subjected to such plating may be further subjected to gold flash plating, thereby reducing contact resistance.

The curvature of each sixth arm is not restricted in particular. Each sixth arm may be fixed to the corresponding electro-conductive portion of the FPC by soldering.

The second header may be formed of synthetic resin.

The printed wiring board may have through holes, via holes, pads-on-holes, and so forth.

A third aspect of the present invention described above has the same advantages as that described in the aforementioned first aspect.

(5) In a connecting structure for a printed wiring board described in (1), at least one of the first arm and the second arm of each of the first contact members is fixed to the electro-conductive portion of the FPC by soldering.

(6) In a connecting structure for a printed wiring board described in (2), the first header is formed by molding, together with the first contact members.

(7) In a connecting structure for a printed wiring board described in (2), the first contact members are pressed into the first header.

(8) In a connecting structure for a printed wiring board described in (3), the first housing has plural grooves formed generally in parallel to each other; the third arms of the second contact members are pressed into the grooves of the first housing.

(9) In a connecting structure for a multi-layer printed wiring board described in (4), the second header is formed by molding, together with the third contact members.

(10) In a connecting structure for a multi-layer printed wiring board described in (4), the third contact members are pressed into the second header.

(11) In a connecting structure for a multi-layer printed wiring board described in (4), the second housing has plural grooves formed generally in parallel to each other; tips of the fifth arms of the third contact members are pressed into the grooves of the first housing.

(12) In a connecting structure for a printed wiring board described in (1), the printed wiring board has a layered structure formed of a first outer layer plate, an inner layer plate having a notch extending to an edge surface thereof, and a second outer layer plate; the line connecting terminals are provided on a surface of the first outer layer plate facing the notch; the insertion opening is formed by being surrounded by the first outer layer plate, the notch of the inner layer plate, and the second outer layer plate.

(13) In a connecting structure for a printed wiring board described in (2), the printed wiring board has a layered structure formed of a first outer layer plate, an inner layer plate having a notch extending to an edge surface thereof, and a second outer layer plate; the line connecting terminals are provided on a surface of the first outer layer plate facing the notch; the insertion opening is formed by being surrounded by the first outer layer plate, the notch of the inner layer plate, and the second outer layer plate.

(14) In a connecting structure for a printed wiring board described in (3), the printed wiring board has a layered structure formed of a first outer layer plate, an inner layer plate having a notch extending to an edge surface thereof, and a second outer layer plate; the line connecting terminals are provided on a surface of the first outer layer plate facing the notch; the insertion opening is formed by being surrounded by the first outer layer plate, the notch of the inner layer plate, and the second outer layer plate.

(15) In a connecting structure for a printed wiring board described in (4), the printed wiring board has a layered structure formed of a first outer layer plate, an inner layer plate having a notch extending to an edge surface thereof, and a second outer layer plate; the line connecting terminals are provided on a surface of the first outer layer plate facing the notch; the insertion opening is formed by being surrounded by the first outer layer plate, the notch of the inner layer plate, and the second outer layer plate.

In general, the first outer layer plate, the inner layer plate, and the second outer layer plate, which have been described above, and the prepreg described later, are formed of epoxy resin. Note that the present invention is not restricted to such an arrangement. Rather, such components may be formed of a material having sufficient heat resistance such as polyimide, BT resin, or the like. Furthermore, such components may be formed of a low dielectric constant material such as low dielectric constant epoxy resin, polyphenylene ether resin, or the like.

The inner layer plate is preferably formed with a thickness of 0.2 mm to 1.6 mm, and is more preferably formed with a thickness of 0.6 mm to 1.0 mm.

On the other hand, each of the first outer layer plate and the second outer layer plate is preferably formed with a thickness of 0.2 mm. Furthermore, the copper film is preferably formed with a thickness of 35 µm.

(16) In a connecting structure for a printed wiring board described in any one of (12) to (15), a prepreg and a copper foil are further layered on the first outer layer plate and the second outer layer plate.

(17) In a connecting structure for a printed wiring board described in (12) to (16), the line connecting terminals of the printed wiring board are subjected to hard plating.

Examples of the hard plating include nickel plating.

According to the aspect of the present invention described in (17), the line connecting terminals are subjected to hard plating. Such an arrangement protects the line connecting terminals from abrasion thereof due to rubbing thereof against the first contact terminals or the second contact terminals due to repeated insertion and extraction of the FPC to and from the printed wiring board. In particular, the printed wiring board formed of a glass-epoxy material has a surface with generally the same roughness as with a relatively rough whetstone. This leads to a problem in that the line connecting terminals are readily worn down.

(18) In a connecting structure for a printed wiring board described in (17), a surface of the line connecting terminals of the printed wiring board thus subjected to hard plating may be further subjected to gold plating.

Further describing above, the line connecting terminals subjected to hard plating are further subjected to gold flash plating. This forms the line connecting terminals with superior contact performance.

DESCRIPTION OF THE PREFERRED EMBODIMENTS

A first embodiment according to the present invention will be described with reference to the drawings hereinafter. Note that with the embodiments described below, the same members are denoted by the same reference numerals, and description thereof will be omitted or simplified.

First Embodiment

Figure 1:
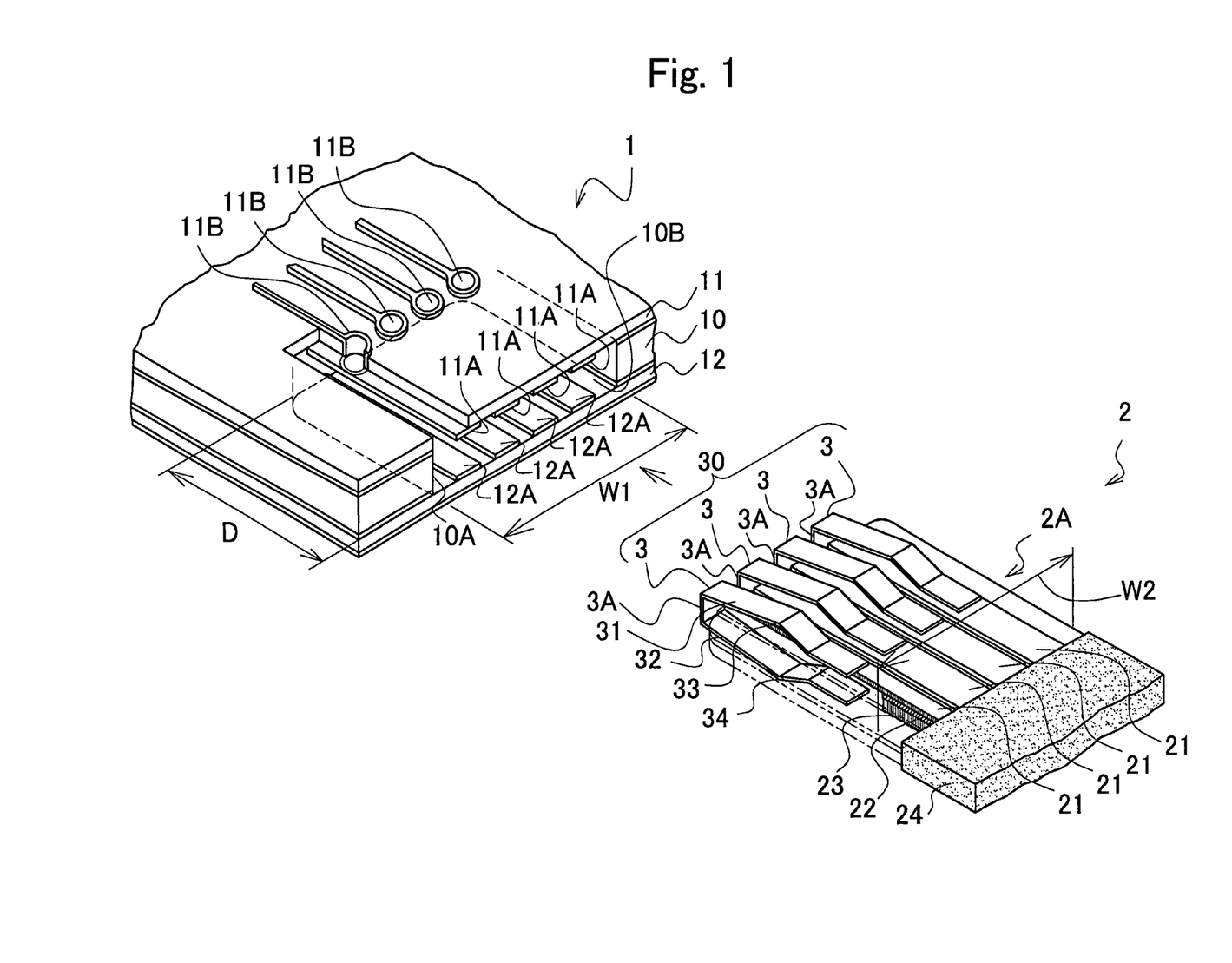
FIG. 1 is a perspective view showing an FPC and a printed wiring board according to a first embodiment of the present invention.

FIG. 1 is a perspective view showing a FPC 2 and a printed wiring board 1 according to a first embodiment of the present invention.

The FPC 2 includes an elongated substrate 22, a reinforcing plate 23 adhered onto the lower face of the substrate 22, and plural electro-conductive portions 21 which are layered on the upper surface of the substrate 22 and extend in an axial direction of the substrate 22.

While the FPC 2 is coated with a polyimide film 24, top end portion thereof is exposed, thereby forming an exposed electro-conductive portion 2A having a width W2.

The substrate 22 is formed of a material having insulating capabilities, e.g., a thin polyimide film.

The electro-conductive portions 21 are formed of a favorable material having electro conductivity and formability, and are subjected to nickel plating.

Furthermore, a dual in-line contact member 30 is fixed to the top end portion of the FPC 2. The dual in-line contact member 30 includes plural first contact members 3 each of which can be elastically deformed.

Each first contact member 3 includes a main body 3A contacting with the top end portion of the FPC 2, and a first arm 31 and a second arm 32 extending from the main body 3A generally in parallel with each other with pinching the FPC 2 therebetween.

The first arm 31 and the second arm 32 are bent at bent portions 33 and 34, respectively, so as to protrude away from each other. The first arm 31 and the second arm 32 are fixed to the corresponding electro-conductive portion of the FPC by soldering.

Figure 2:
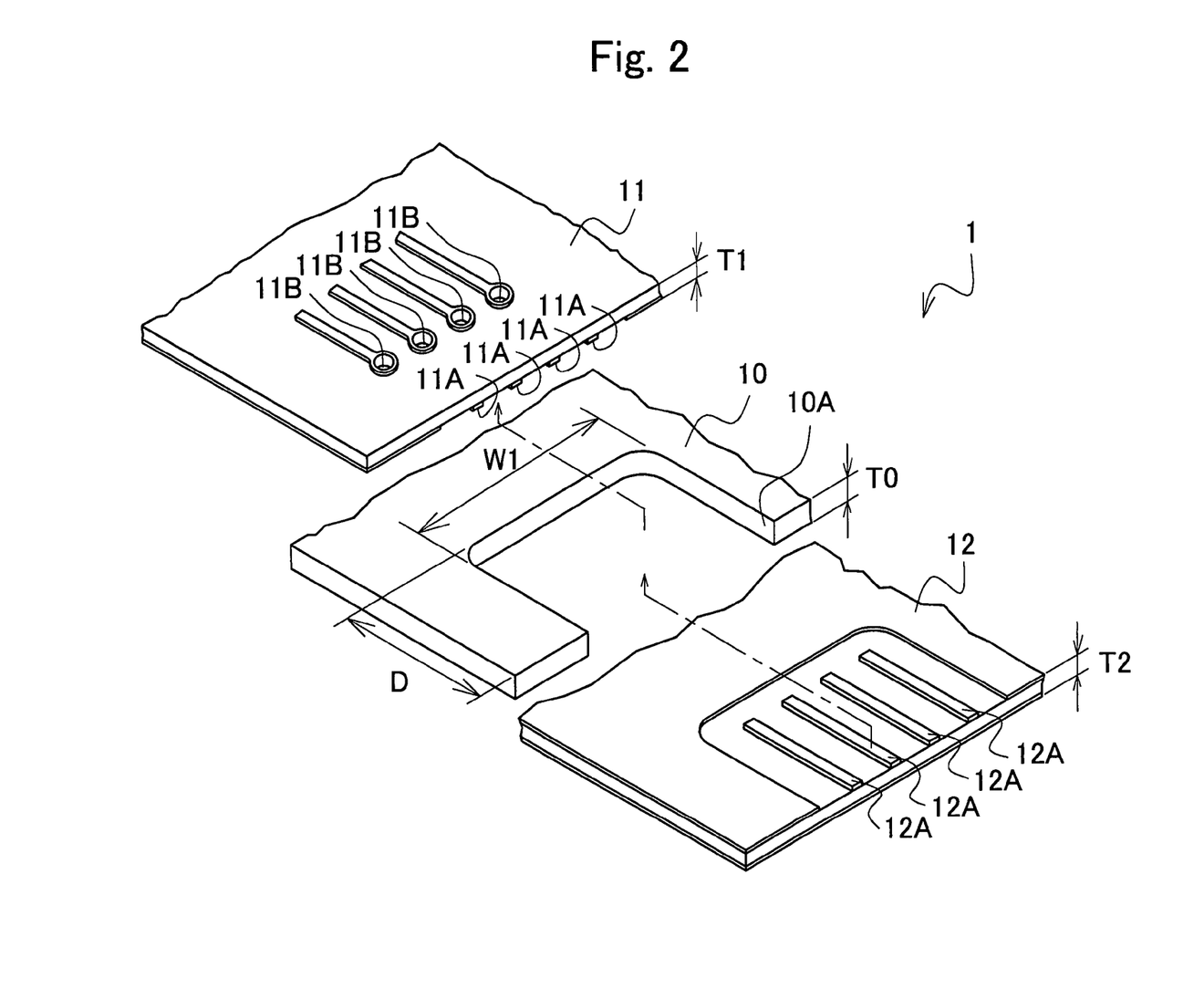
FIG. 2 is an exploded perspective view of the printed wiring board according to the first embodiment.

FIG. 2 is an exploded perspective view of the printed wiring board 1.

The printed wiring board 1 has a structure in which a first outer layer plate 11, an inner layer plate 10, and a second outer layer plate 12 are layered.

The inner layer plate 10 is formed of an insulating plate member, and specifically it is formed of an epoxy glass plate. The inner layer plate 10 is formed with a thickness T0, and has a notch 10A formed with a width W1 and with a depth D extending to an edge surface thereof.

The first outer layer plate 11 is formed with a thickness T2, and specifically it is formed with a thickness of 0.2 mm. Printed wiring patterns are provided on both surfaces of the first outer layer plate 11 by etching of copper foils. Specifically, each copper foil is formed with a thickness of 35 μm. After the wiring patterns have formed, through holes 11B are formed.

The second outer layer plate 12 is formed with a thickness T3, and specifically it is formed with a thickness of 0.2 mm. Printed wiring patterns are provided on a surface of the second outer layer plate 12 facing the inner layer plate 10 by etching of a copper foil. Specifically, the copper foil is formed with a thickness of 35 μm.

The printed wiring board 1 is manufactured with a procedure described below.

That is to say, the first outer layer plate 11, the inner layer plate 10, and the second outer layer plate 12 are layered in that order, are pressed, and are connected with each other by solder plating. Then, through holes, via holes, pads-on-holes, and so forth, are formed in the plate members 10 through 12 thus connected with each other, and the layered plate members 10 through 12 are subjected to plating processing and resist processing.

The first outer layer plate 11, the notch 10A of the inner layer plate 10, and the second outer layer plate 12 form an insertion opening formed on an edge surface of the printed wiring board 1, into which the top end portion of the FPC 2 is inserted.

The width W1 of the notch 10A is slightly greater than the width W2 of the FPC 2. The notch 10A suppresses misalignment of the FPC 2 in the width direction thereof, so that each of the first contact members 3 of the FPC 2 can be aligned with corresponding line connecting terminals 11A and 12A of the printed wiring board 1.

Figure 3:
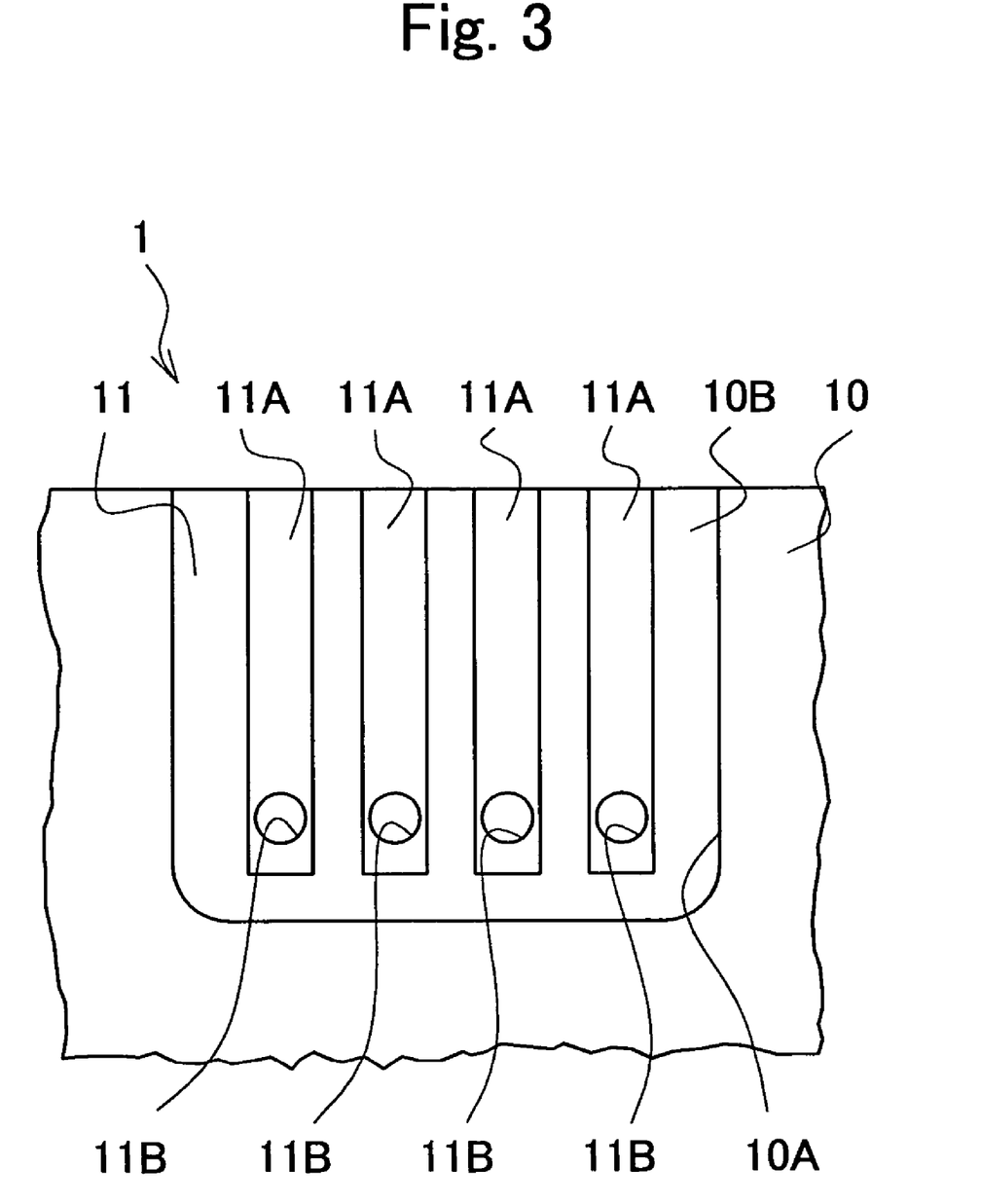
FIG. 3 is a cross-sectional view showing a first outer layer plate as viewed from a notch according to the first embodiment.

FIG. 3 is a cross-sectional view of the first outer layer plate 11 as viewed from the notch 10A.

The first outer layer plate 11 forming an inner wall face of the insertion opening 10B has plural line connecting terminals 11A formed so as to extend in an insertion direction for inserting the FPC 2. These line connecting terminals 11A are disposed at positions each corresponding to that of the first arm 31 of the first contact member 3 of the FPC 2.

The second outer layer plate 12 forming another inner wall face of the insertion opening 10B has plural line connecting terminals 12A formed so as to extend in the insertion direction for inserting the FPC 2. These line connecting terminals 12A are disposed at positions each corresponding to that of the second arm 32 of the first contact member 3 of the FPC 2.

The line connecting terminals 11A and 12A are subjected to nickel plating as hard plating. The line connecting terminals 11A and 12A may be subjected to hard plating other than nickel plating. Such an arrangement protects the line connecting terminals 11A and 12A from abrasion thereof due to rubbing thereof against the arms 31 and 32 of the first contact members 3 even when the FPC 2 is inserted into or removed from the printed wiring board 1 repeatedly. In particular, the printed wiring board 1 formed of a glass-epoxy material has a surface with generally the same roughness as with a relatively rough whetstone. This leads to a problem that the line connecting terminals 11A and 12A are readily worn down.

Furthermore, the line connecting terminals 11A and 12A subjected to nickel plating are further subjected to gold flash plating. Such an arrangement forms the line connecting terminals 11A and 12A with superior contact performance.

The first outer layer plate 11 of the printed wiring board 1 has plural through holes 11B formed so as to be connected to the line connecting terminals 12A. The outer surface of the first outer layer plate 11 is electrically connected to the line connecting terminals 12A through the through holes 11B.

Next, a procedure for inserting the FPC 2 to the printed wiring board 1 will be described.

When the top end portion of the FPC 2 is inserted into the insertion opening 10B of the printed wiring board 1, the bent portions 33 and 34 of the first contact member 3 come in contact with edges of the insertion opening 10B. Thus, the first arm 31 and the second arm 32 of the first contact member 3 are pressed by the inner wall faces of the insertion opening 10B, and are elastically bent to come close to the electro-conductive portion 21. When the FPC 2 is inserted deeper, the bent portions 33 and 34 of each first contact member 3 come into contact with and press the corresponding line connecting terminals 11A and 12A, respectively.

With the present embodiment, the line connecting terminals 11A and 12A are provided on the surfaces facing to each other within the insertion opening 10B, and the first arm 31 and the second arm 32 of each first contact member 3 are contacted to each of the corresponding line connecting terminals 11A and 12B, respectively. This allows connection of the FPC 2 to the printed wiring board 1 in reliable manner.

Furthermore, pins or the like can be inserted into each of the through holes 11B so as to press the first contact members 3 by the tip of the pin, thereby the first contact members 3 can be disengaged from the printed wiring board 1 with ease.

Second Embodiment

Figure 4:
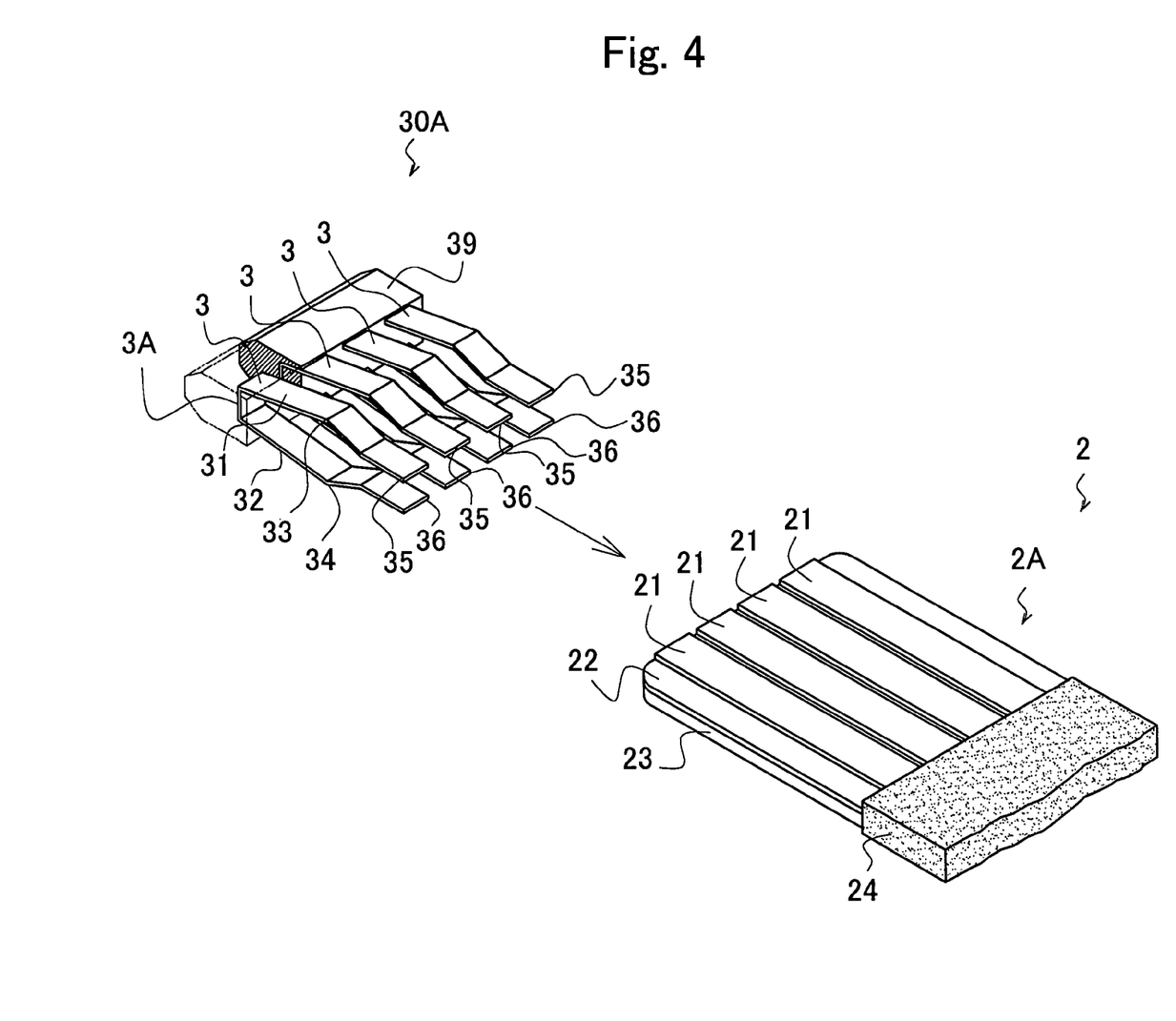
FIG. 4 is a perspective view of an FPC according to a second embodiment of the present invention.

With the present embodiment, a dual in-line contact member 30A has a different configuration from that of the first embodiment.

FIG. 4 is a perspective view of the FPC 2 according to the second embodiment of the present invention.

The dual in-line contact member 30A includes a first header 39 holding the main bodies 3A of the first contact members 3 in a state in which the first contact members 3 are arrayed. The first header 39 is formed of synthetic resin and is formed by molding, together with the first contact members 3.

With the present embodiment, the plural first contact members 3 are arrayed with sufficient precision so that the FPC 2 can be connected to the printed wiring board 1 in more reliable surer manner.

Figure 5:
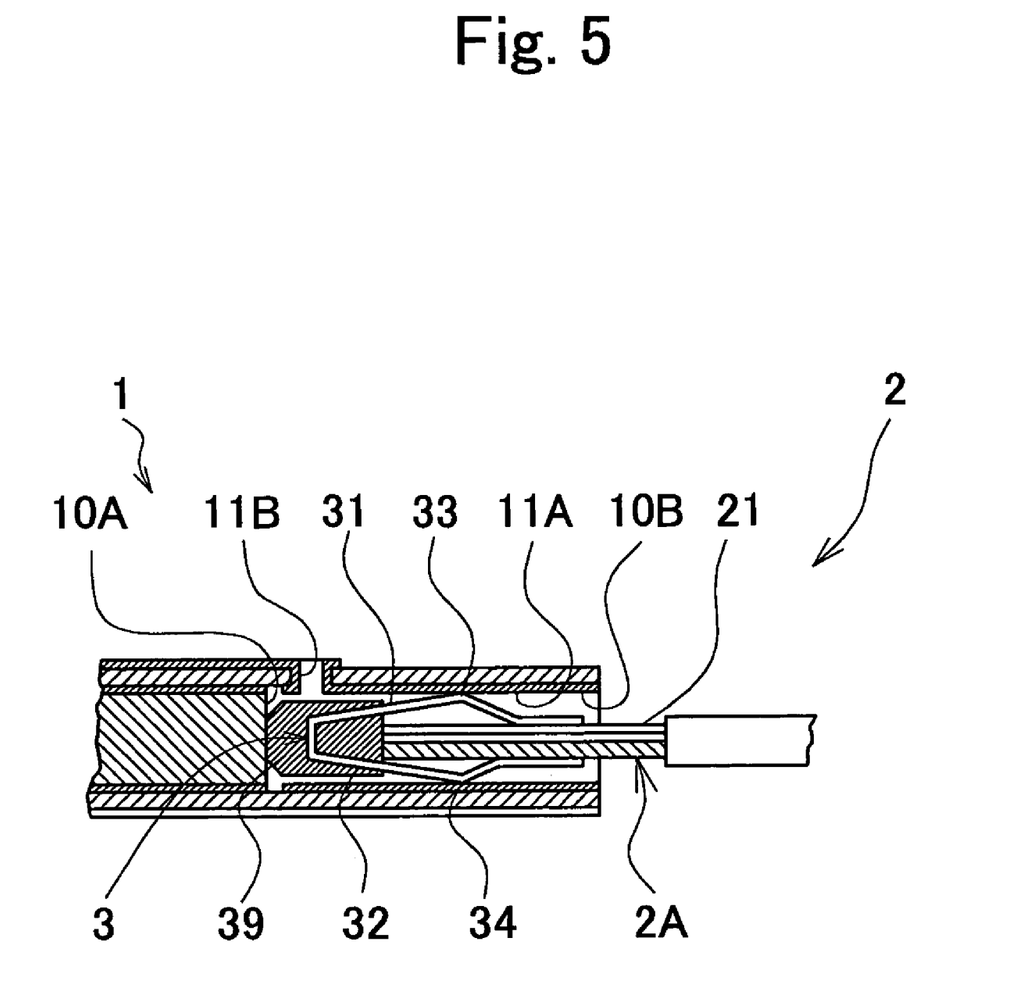
FIG. 5 is a diagram for describing a procedure for inserting the FPC to the printed wiring board according to the second embodiment.

Next, a procedure for inserting the FPC 2 to the printed wiring board 1 will be described with reference to FIG. 5.

When the top end portion of the FPC 2 is inserted into the insertion opening 10B of the printed wiring board 1, the bent portions 33 and 34 of each first contact member 3 come in contact with the edges of the insertion opening 10B. Thus, the first arm 31 and the second arm 32 of each first contact member 3 are elastically bent by being pressed by the inner wall faces of the insertion opening 10B, and come close to the electro-conductive portion 21. When the FPC is inserted deeper, the first arm 31 and the second arm 32 of the first contact member 3 come into contact with and press the corresponding line connecting terminals 11A and 12A, respectively.

Third Embodiment

Figure 6:
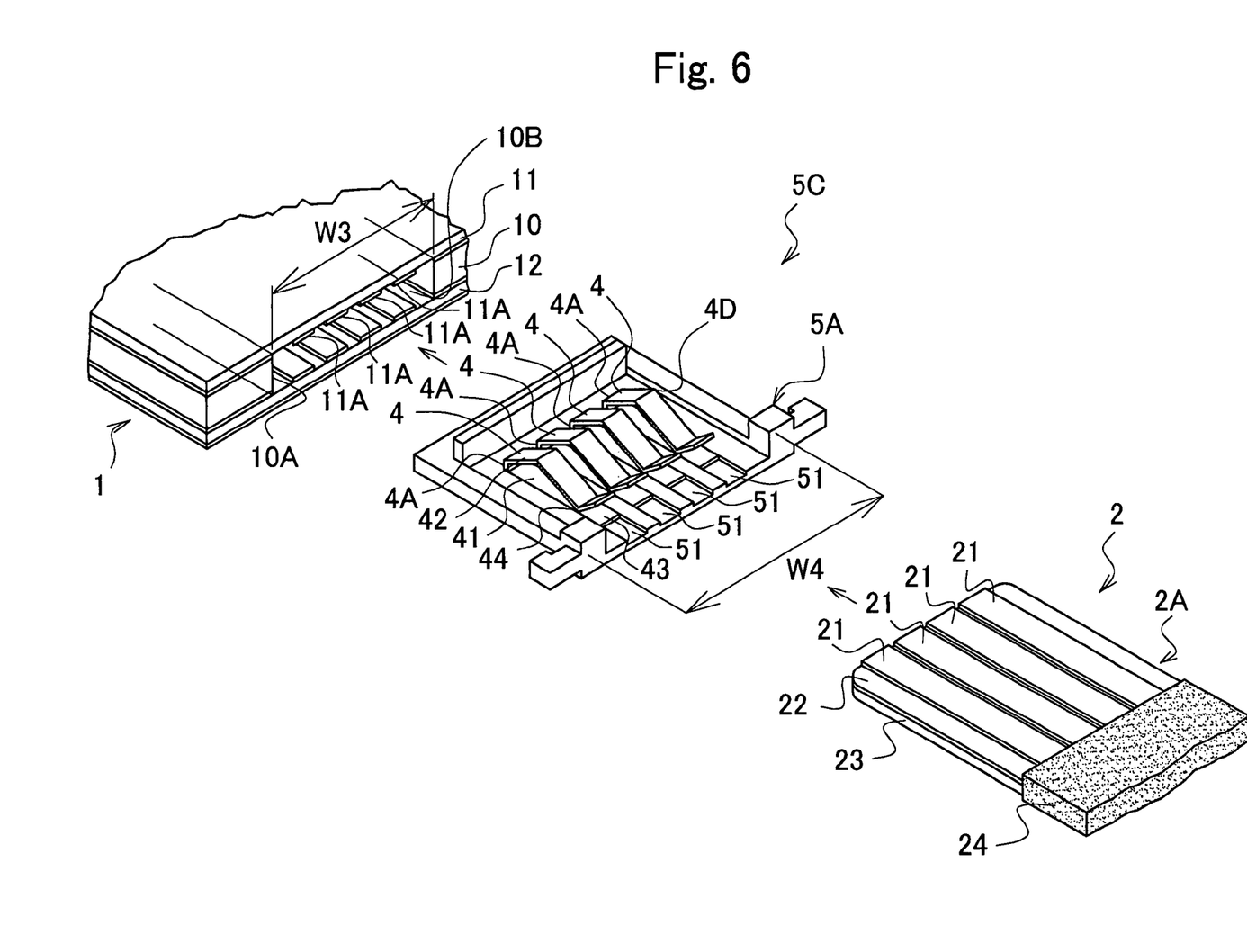
FIG. 6 is a perspective view of an FPC and a printed wiring board according to a third embodiment of the present invention.

The present embodiment has generally the same configuration as that of the first embodiment, except for a first adapting connector 5 fixed to the top end portion of the FPC 2 instead of the dual in-line contact member 30.

FIG. 6 is a perspective view of the FPC 2 and the printed wiring board 1 according to the present embodiment.

In the top end portion of the FPC 2, the first adapting connector 5 which includes plural elastically deformable second contact members 4 and a first housing 5A holding the second contact members 4 is fixed. Each second contact member 4 includes a main body 4A contacting with the top end portion of the FPC 2, and a third arm 41 and a fourth arm 42 extending from the main body 4A along the surface of the first housing 5A with pinching the electro-conductive portion 21 therebetween. The fourth arm 42 is bent at a bending portion 4D to protrude outward from the first housing 5A.

The first housing 5A holds the third arms 41 of the second contact members 4 in a state in which the second contact members 4 are arrayed. The first housing 5A has multiple grooves 51 formed generally in parallel to each other and each of the third arms 41 of the second contact members 4 are pressed into each of the grooves 51.

The width W3 of the notch 10A is slightly greater than a width W4 of the first housing 5A. The notch 10A suppresses misalignment of the FPC 2 in the width direction thereof, so that each of each the second contact members 4 of the FPC 2 can be aligned with the corresponding line connecting terminal 11A of the printed wiring board 1.

Figure 7:
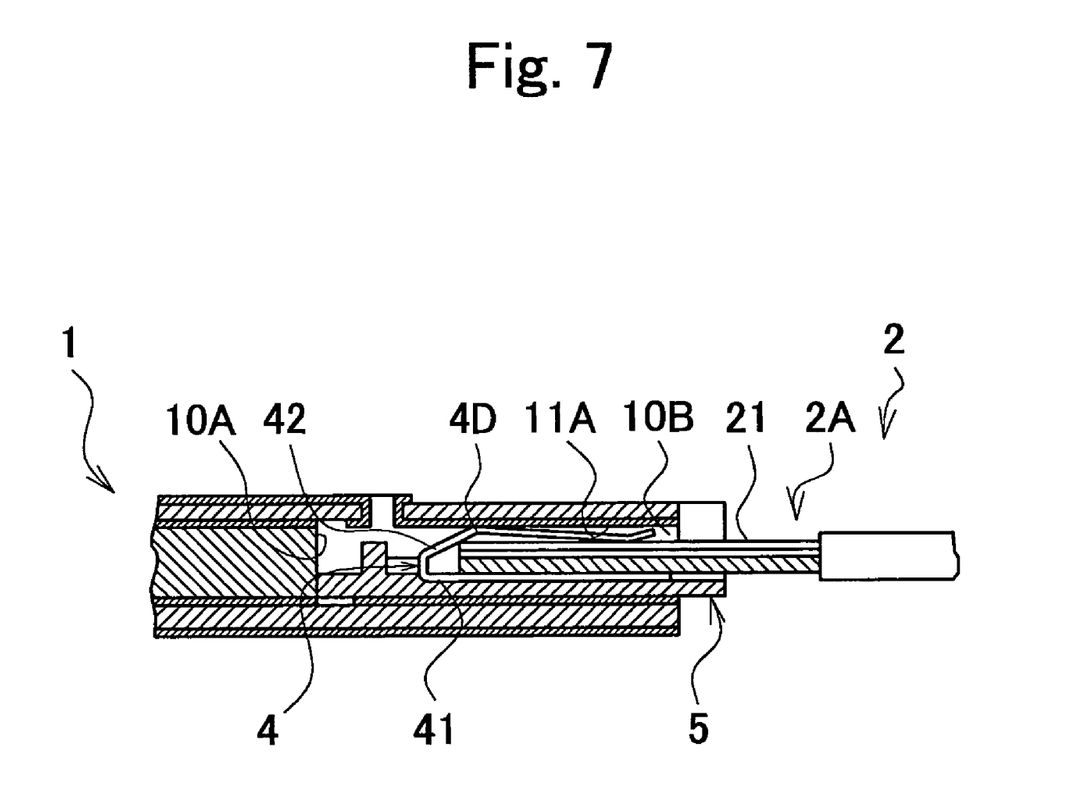
FIG. 7 is a diagram for describing a procedure for inserting the FPC to the printed wiring board according to the third embodiment.

Next, a procedure for inserting the FPC 2 to the printed wiring board 1 will be described with reference to FIG. 7.

When the top end portion of the FPC 2 is inserted into the insertion opening 10B of the printed wiring board 1, the bent portion 4D of the second contact member 4 comes in contact with the edge of the insertion opening 10B. Thus, the fourth arm 42 of the second contact member 4 is pressed by the inner wall face of the insertion opening 10B, and is elastically bent to come close to the electro-conductive portion 21. When the FPC 2 is inserted deeper, the bent portion 4D of the second contact member 4 come into contact with and press the corresponding line connecting terminal 11A.

Fourth Embodiment

Figure 8:
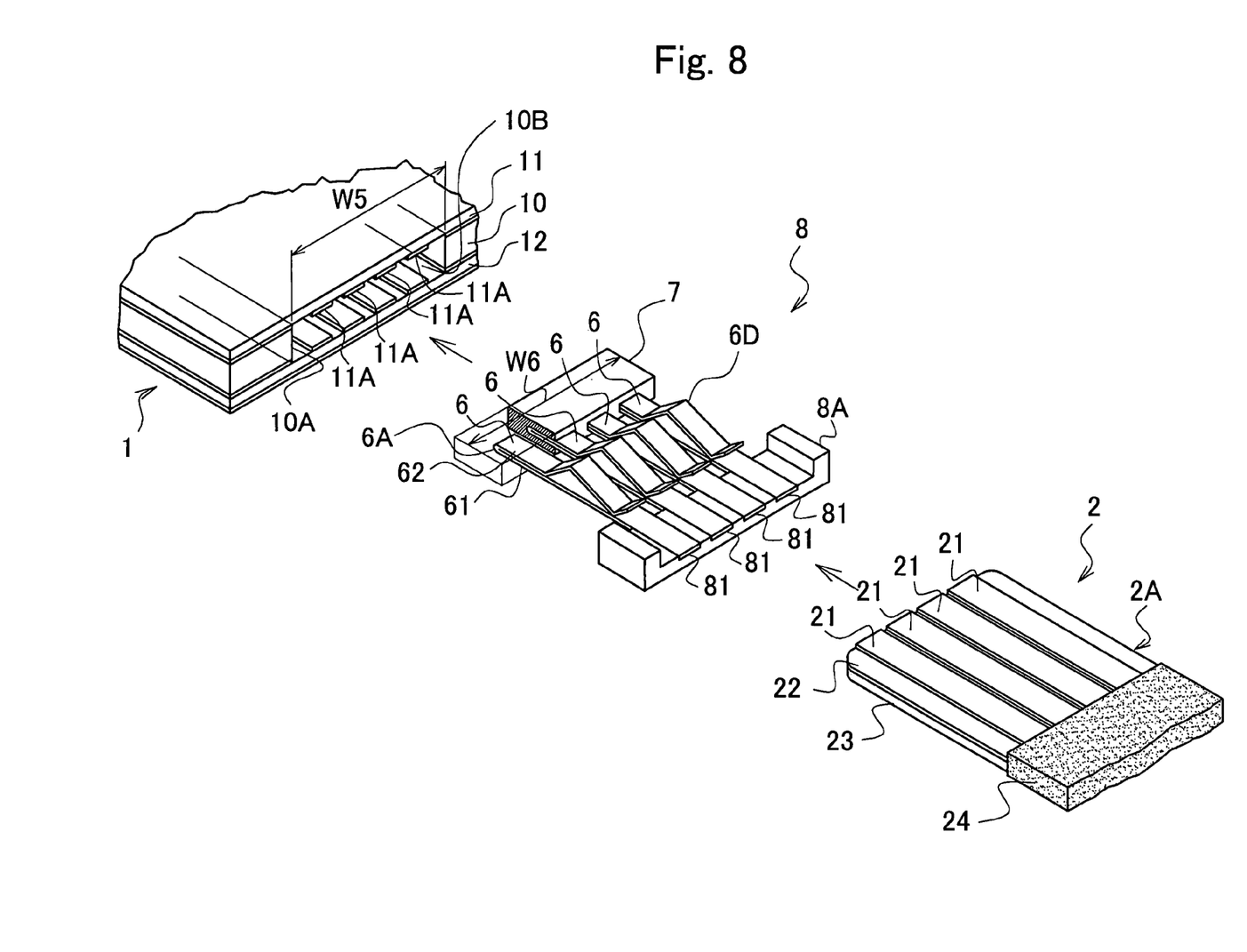
FIG. 8 is a perspective view of an FPC and a printed wiring board according to a fourth embodiment of the present invention.

The present embodiment has generally the same configuration as that of the first embodiment, except for a second adapting connector 8 fixed to the top end portion of the FPC 2 instead of the dual in-line contact member 30.

FIG. 8 is a perspective view of the FPC 2 and the printed wiring board 1 according to the present embodiment.

The second adapting connector 8 which includes plural elastically deformable third contact members 6, and a second housing 8A and a second header 7 holding the third contact members 6 is fixed to the top end portion of the FPC 2.

Each third contact member 6 includes a main body 6A contacting with the top end portion of the FPC 2, and a fifth arm 61 and a sixth arm 62 extending from the main body 6A generally in parallel to each other while pinching the FPC 2 therebetween. The sixth arm 62 is bent at a bending portion 6D to protrude outward from the second housing 8A.

The second housing 8A holds the fifth arms 61 of the third contact members 6 in a state in which the third contact members 6 are arrayed. The first housing 8A has plural multiple grooves 81 formed generally in parallel to each other and each of the fifth arms 61 of the third contact members 6 is pressed into each of the grooves 81.

The aforementioned second header 7 holds the main bodies 6A of the third contact members 6 in a state in which the third contact members 6 are arrayed. The second header 7 is formed of synthetic resin and is formed by molding, together with the third contact members 6.

The width W5 of the notch 10A is slightly greater than a width W6 of the second header 7. The notch 10A suppresses misalignment of the FPC 2 in the width direction thereof, so that each of the third contact members 6 of the FPC 2 can be aligned with the corresponding line connecting terminal 11A formed on the printed wiring board 1.

Figure 9:
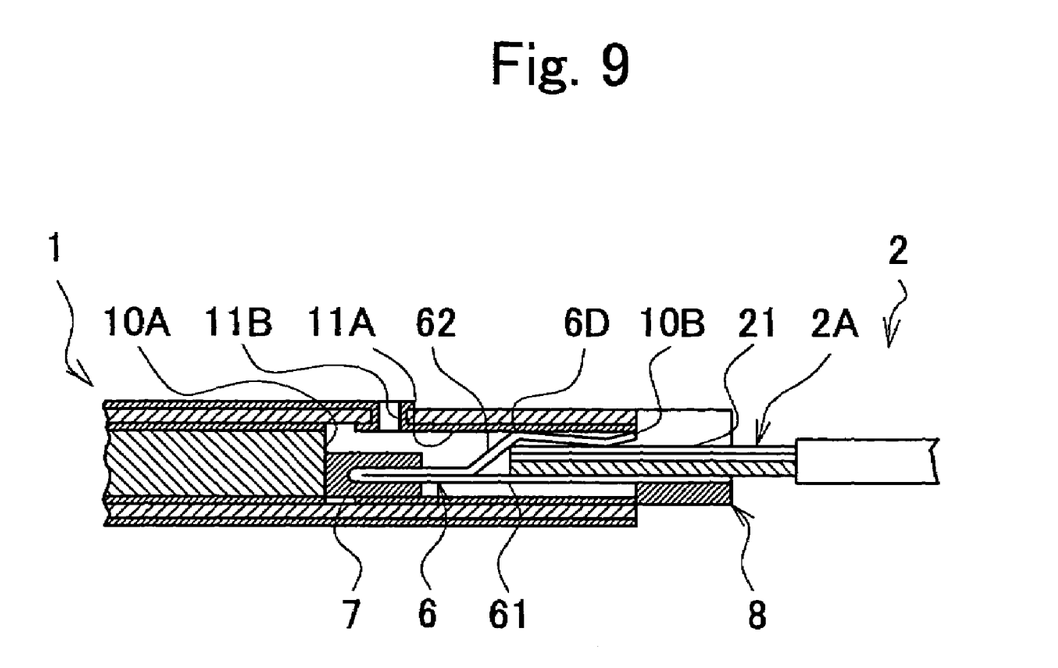
FIG. 9 is a diagram for describing a procedure for inserting the FPC to the printed wiring board according to the fourth embodiment.

Next, a procedure for inserting the FPC 2 to the printed wiring board 1 will be described with reference to FIG. 9.

When the top end portion of the FPC 2 is inserted into the insertion opening 10B of the printed wiring board 1, the bent portion 6D of the third contact member 6 comes in contact with the edge of the insertion opening 10B. Thus, the sixth arm 62 of the third contact member 6 is elastically bent by being pressed by the inner wall face of the insertion opening 10B, and comes close to the electro-conductive portion 21. When the FPC 2 is inserted deeper, the bent portion 6D of the third contact member 6 come into contact with and presses the corresponding line connecting terminal 11A.

The present invention has the following advantages.

Circuit elements can be mounted at high density, the freedom of design of the wiring pattern is improved as well, because the FPC can be connected to an edge surface of the printed wiring board.

Furthermore, the present invention allows an existing FPC to be connected to a printed wiring board simply by mounting the first contact members onto the existing FPC having a substrate and an electro-conductive portion. This reduces cost for connecting a printed wiring board and a FPC.

The invention claimed is:

1. A connecting device providing an electrical connection between a Flexible Printed Circuit (FPC) and a printed wiring board, comprising:
    an elongated substrate provided in the FPC;
    a plurality of electrically conductive members layered on a surface of the substrate in an axial direction of the substrate;
    a slot formed in an edge surface of the printed wiring board;
    a plurality of line connecting terminals formed on an inner wall face of the slot, each line connecting terminal extending in a direction of inserting the FPC; and
    a dual in-line contact member having a plurality of independently and elastically U-shaped deformable contacts, the dual in-line contact member being attached to the top end portion of the FPC,
    wherein each of said contacts includes a main body abutting the top end portion of the FPC, and a first arm and a second arm each extending from the main body so as to hold an electrically conductive member of said FPC therebetween,
    wherein each of the first arm and the second arm has a bent portion bending outwardly,
    wherein when the FPC is inserted into the slot of the printed wiring board, at least one of the first arm and the second arm comes into pressure contact at the bent portion with a line connecting terminal provided in the slots,
    wherein said printed wiring board has a layered structure formed of a first outer layer plate having a plurality of through holes, an inner layer plate having an elongated notch extending to an edge surface thereof, and a second outer layer plate,
    wherein said line connecting terminals are provided on an inner surface of said first outer layer plate facing said notch and correspondent to the through holes, and
    wherein said slot is formed by being surrounded by said first outer layer plate, said notch of said inner layer plate, and said second outer layer plate.

2. A connecting device according to claim 1, wherein at least one of said first arm and said second arm of each of said contacts is fixed to said electrically conductive member of said FPC by soldering.

3. A connecting device according to claim 1, wherein a prepreg and a copper foil are further layered on said first outer layer plate and said second outer layer plate.

4. A connecting device according to claim 1, wherein said line connecting terminals of said printed wiring board are subjected to hard plating.

5. A connecting device according to claim 4, wherein a surface of each said line connecting terminals of said printed wiring board thus subjected to hard plating are further subjected to gold plating.

* * * * *